United States Patent [19]

Awaya et al.

[11] Patent Number: 4,796,233

[45] Date of Patent: Jan. 3, 1989

[54] BIPOLAR-TRANSISTOR TYPE SEMICONDUCTOR MEMORY DEVICE HAVING REDUNDANCY CONFIGURATION

[75] Inventors: Tomoharu Awaya, Yokohama; Isao Fukushi, Tokyo, both of Japan

[73] Assignee: Fujitsu Limited, Kawasaki, Japan

[21] Appl. No.: 788,587

[22] Filed: Oct. 17, 1985

[30] Foreign Application Priority Data

| Oct. 19, 1984 | [JP] | Japan | 59-218707 |
| Nov. 14, 1984 | [JP] | Japan | 59-238581 |
| Nov. 14, 1984 | [JP] | Japan | 59-238582 |

[51] Int. Cl.$^4$ ............................................. G11C 7/00
[52] U.S. Cl. ....................................... 365/200; 371/10
[58] Field of Search ..................... 365/200, 210, 230; 371/10

[56] References Cited

U.S. PATENT DOCUMENTS

| 4,365,319 | 12/1982 | Takemae | 365/200 |
| 4,399,372 | 8/1983 | Tanimoto et al. | 365/200 X |
| 4,428,068 | 1/1984 | Baba | 365/200 |
| 4,592,024 | 5/1986 | Sakai et al. | 365/200 |

*Primary Examiner*—Joseph A. Popek
*Attorney, Agent, or Firm*—Staas & Halsey

[57] ABSTRACT

A bipolar-transistor type semiconductor memory device including a normal memory cell array, redundancy memory cell array, a redundancy driving circuit, and a redundancy address decision circuit. When the redundancy address decision circuit determines that the input address coincides with the address of a defective circuit portion, the redundancy driving circuit is driven to enable the redundancy memory cell array instead of the normal memory cell array.

11 Claims, 4 Drawing Sheets

BIPOLAR-TRANSISTOR TYPE SEMICONDUCTOR MEMORY DEVICE HAVING REDUNDANCY CONFIGURATION

CROSS REFERENCE TO RELATED APPLICATION

This application is cross-referenced to U.S. application Ser. No. 788,458, filed Oct. 17, 1985.

BACKGROUND OF THE INVENTION

1. Field of the Invention

The present invention relates to a semiconductor memory device. In particular, the present invention is directed to a bipolar-transistor type semiconductor memory device having a redundancy circuit portion for replacing a defective circuit portion such as a defective memory cell.

2. Description of the Related Art

In a random-access memory (RAM) device, a large number of memory cells are arranged along rows and columns. The density of defects generated in such a semiconductor memory device during the manufacture thereof is relatively independent of the integration density of the device. Rather, defects arise from the semiconductor manufacturing technology. In general, the higher the integration density of the device, the greater the ratio of normal memory cells to defective memory cells. This is one of the advantages of increasing the integration density of a semiconductor memory device. Even if a device includes only one defective memory cell, however, the device cannot be operated normally and, therefore, must be scrapped. As a result, despite the lower ratio of defective memory cells, greater integration density means reduced manufacturing yield.

In a metal-insulator-semiconductor (MIS) type RAM, in order to overcome the problem of defective memory cells, redundancy memory cells are employed. When a defective memory cell is detected, a redundancy memory cell row or column is selected instead of the memory cell row or column including the defective memory cell. In general, one or two redundancy memory cell rows or columns are usually provided.

In the prior art, however, there have been no bipolar-transistor type RAMs having a redundancy configuration, because there have been no redundancy configurations suitable for a bipolar-transistor type RAM, which operates at a much higher speed than a MIS type RAM. Also, there has not been any strong demand for a redundancy configuration for a bipolar-transistor type RAM, due to the comparatively small number of memory cells therein.

With improvements in integration technology for bipolar-transistor type RAMs and the requirement for more of memory cells, however, bipolartransistor type RAM devices having a large number of memory cells have come into demand. Accordingly, bipolar-transistor type RAMs having a redundancy configuration have come into demand.

SUMMARY OF THE INVENTION

Accordingly, it is an object of the present invention to provide a bipolar-transistor type semiconductor memory device wherein a defective circuit portion can be replaced by a redundancy circuit portion having a simple circuit structure, thus improving the yield of the production of the memory device.

According to a fundamental aspect of the present invention, there is provided a bipolar-transistor type semiconductor memory device having a redundancy configuration which includes a memory cell array, a redundancy memory cell array, and a driving circuit including an emitter-coupled logic gate for comparing a voltage level of an input signal with a voltage level of a reference signal to enable the memory cell array. Also included are a redundancy driving circuit including an emitter-coupled logic gate for comparing a voltage level of the input signal with a voltage level of a reference signal to enable the redundancy memory cell array, and a redundancy address decision circuit for deciding whether an input address coincides with an address of a defective circuit portion and for outputting a switching signal in accordance with results of the decision. The switching signal is applied to an input signal terminal of the emitter-coupled logic gate of the redundancy driving circuit and a reference signal terminal of the emitter-coupled logic gate of the driving circuit. In this device, when the redundancy address decision circuit decides that the input address coincides with the address of a defective circuit portion, the driving circuit is inhibited and the redundancy driving circuit is driven to enable the memory cell of the redundancy memory cell array.

According to another aspect of the invention, there is provided a bipolar-transistor type semiconductor memory device having a redundancy configuration which includes a memory cell array, a redundancy memory cell array, a decoding circuit for decoding an input address, and a driving circuit connected to the decoding circuit for enabling the memory cell array in accordance with the input address. Also included are a redundancy driving circuit capable of enabling the redundancy memory cell array, a redundancy address decision circuit for deciding whether the input address coincides with an address of a defective circuit portion and for outputting a switching signal in accordance with the results of the decision, and a redundancy selection circuit for placing all output signals of the decoding circuit in the non-selection state while driving the redundancy driving circuit to enable the redundancy memory cell array instead of the defective circuit portion on the basis of the switching signal output from the redundancy address decision circuit. In this device, when the redundancy address decision circuit decides that the input address coincides with the address of the defective circuit portion, the driving circuit is inhibited and the redundancy driving circuit is driven to enable the memory cell of the redundancy memory cell array.

BRIEF DESCRIPTION OF THE DRAWINGS

Embodiments of a bipolar-transistor type semiconductor memory device in accordance with the present invention will now be described with reference to the accompanying drawings, in which.

DESCRIPTION OF THE PREFERRED EMBODIMENTS

Figure 1:
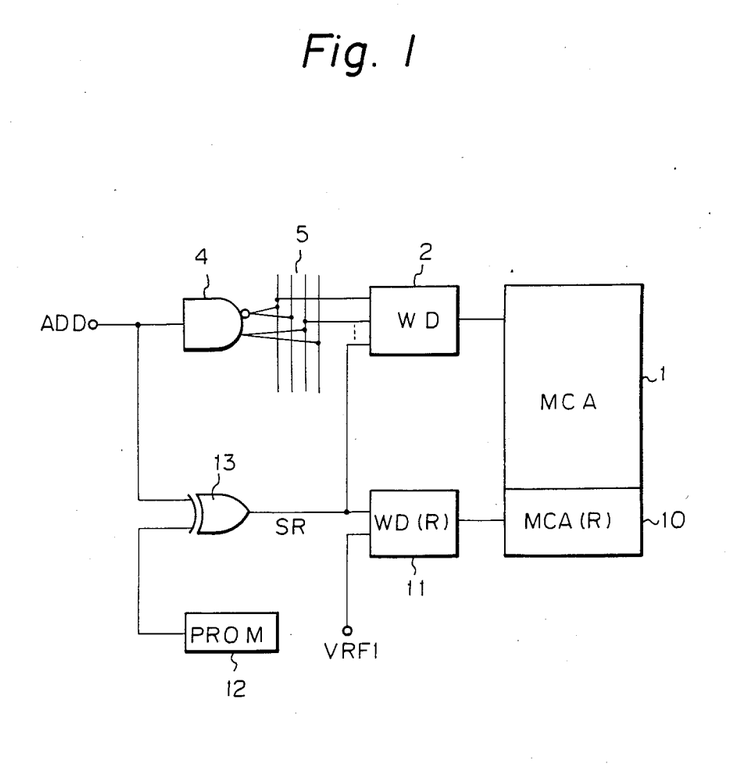
FIG. 1 is a partial block diagram of one embodiment of the bipolar-transistor type semiconductor memory device according to the present invention.
Figure 2:
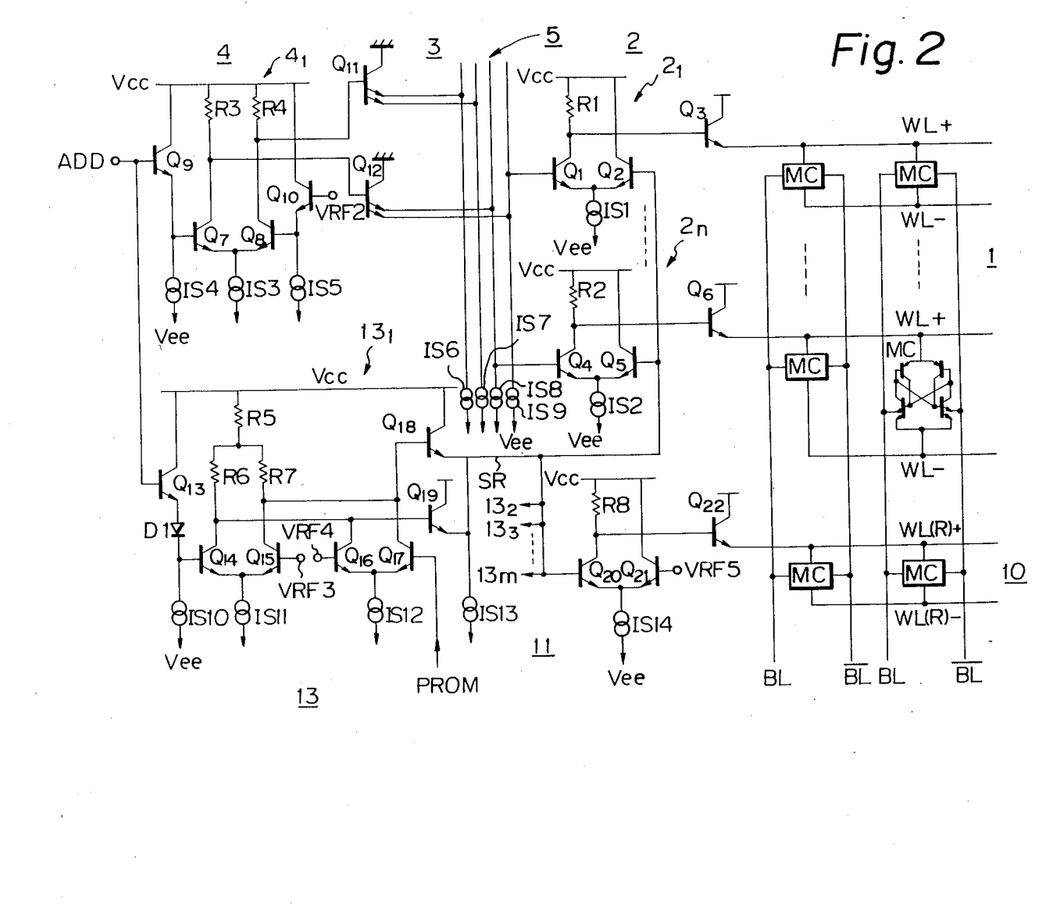
FIG. 2 is a more detailed circuit diagram of the memory device of FIG. 1.

FIG. 1 is an embodiment of a semiconductor memory device according to the present invention. This semiconductor memory device is able to replace a defective circuit portion with a redundancy circuit portion in word line units. In FIG. 1, the semiconductor memory device includes a memory cell array 1, a word driver 2, an address buffer 4 for receiving a word address, a decoder line 5, a redundancy memory cell array 10 connected to a redundancy word line, a redundancy word driver 11, a programmable read-only memory (PROM) 12 for storing an address of the redundancy circuit portion, and a comparison gate circuit 13 for comparing the input word address ADD with the data read out from the PROM 12. In FIG. 2, the address buffer for the bit address, bit driver, inputoutput circuit, etc. are not shown for simplification of the drawing.

In the memory device of FIG. 1, read and write operations are effected by applying a word address ADD and bit address to the word address buffer 4 and bit address buffer (not shown), respectively. At this time, the word address ADD is input to the comparison gate circuit 13 to be compared with the address data, such as a defective word output from the PROM 12 corresponding to a defective circuit portion. This address data of the defective circuit portion is written into the PROM 12, for example, when the defective circuit portion is found during testing of the goods. Such a PROM suitable for this purpose is disclosed, for example, in Japanese Patent Application No. 59-218707 (corresponding to U.S. Ser. No. 788,458).

If the comparison shows the two addresses do not coincide, no redundancy circuit selection signal (referred to as selection signal hereafter) SR is output. As a result, the memory cell array 1 is accessed and read and write operations of the data are effected.

On the contrary, if the input word address ADD coincides with the defective word address from the PROM 12, the selection signal SR is output from the comparison gate circuit 13 to each word driver 2 and the redundancy word driver 11. The word driver 2 is inhibited due to the application of the selection signal SR, so that the word line selection signal is cut off. On the other hand, the redundancy word driver 11 outputs the word line selection signal to the redundancy memory cell array 10 due to the application of the selection signal SR. The redundancy memory cell array 10 is thereby selected, so that the read and write operations of the data for the redundancy memory cell array 10 are carried out.

FIG. 2 is a circuit diagram of the memory device of FIG. 1. In FIG. 2, the device includes the memory cell array 1, the word driver 2, the word decoder 3, the address buffer 4, the redundancy memory cell array 10, the redundancy word driver 11, the comparison gate circuit 13, etc.

The memory cell array 1 includes a plurality of memory cells MC connected between a high voltage word line WL+ and a low voltage word line WL− and between bit lines BL and $\overline{BL}$. The word driver 2 includes a plurality of word driver units $2_1$ to $2_n$ each corresponding to a word line in the memory cell array 1. Each word driver unit is constructed in the same manner, for example, the word driver unit $2_1$ includes two transistors Q1 and Q2, whose emitters are commonly connected to a constant current circuit IS1 which is connected to a low voltage power supply $V_{ee}$, a load resistor R1 connected between the collector of the transistor Q1 and a high voltage power supply $V_{cc}$, and a driver transistor Q3 whose base is connected to the collector of the transistor Q1. The transistors Q1 and Q2, the resistor R1, and the constant current circuit IS1 form an emitter-coupled logic (ECL) gate.

The address buffer 4 includes a plurality of the address buffer units $4_1$ to $4_m$ provided for every bit of the input word address ADD. The address buffer unit $4_1$ generally includes two transistors Q7 and Q8 whose emitters are commonly connected, a constant current circuit IS3, two load resistors R3 and R4, a transistor Q9 and constant current circuit IS4 forming an input emitter follower circuit, and a transistor Q10 and a constant current circuit IS5 forming an emitter follower circuit to which the reference voltage VRF2 is applied. Further, the word decoder 3 includes two multi-emitter transistors Q11 and Q12, which receive the output signal from the address buffer unit $4_1$, decoder lines 5 to which each emitter of the multi-emitter transistors are connected, and four constant current circuits IS6, IS7, IS8 and IS9, connected between each of the decoder lines 5 and the low voltage power supply $V_{ee}$, respectively. The address buffer units, such as $4_1$, are provided for every bit of the word address. The outputs are suitably connected to each of the decoder lines 5 via two multi-emitter transistors, respectively. Further, the decoder lines 5 are connected to the input terminals of the word driver units $2_1$ to $2_n$, respectively.

The redundancy memory cell array 10 has a plurality of memory cells connected between a high voltage redundancy word line WL(R)+ and a low voltage redundancy word line WL(R)− and between a pair of bit lines BL and $\overline{BL}$ common to the memory cell array 1. The redundancy word driver 11 has the same construction as the word driver units of the word driver 2 and includes transistors Q20, Q21, and Q22, a resistor R8, and a constant current circuit IS14. A reference voltage VRF5 is applied to the base of the transistor Q21.

The comparison gate circuit 13 includes a plurality of comparison gate units $13_1$ to $13_m$ provided for every bit of the word address ADD. The comparison gate unit $13_1$ includes transistors Q13 to Q19, constant current circuits IS10 to IS13, generally a diode D1, and resistors R5, R6, and R7. The transistor Q13, the diode D1, and the constant current circuit IS10 form an input emitter follower circuit. The commonly-connected emitters of the transistors Q14 and Q15 are connected to the low voltage power supply $V_{ee}$ via the constant current circuit IS11. The commonlyconnected emitters of the transistors Q16 and Q17 are also connected to the low voltage power supply $V_{ee}$ via the constant current circuit IS12. Further, the reference voltages VRF3 and VRF4 are applied to the bases of the transistors Q15 and Q16 respectively, and the output signal of the PROM, corresponding to one bit of the defective address, is applied to the base of the transistor Q17. The collectors of the transistors Q14 and Q16 are connected together and to the base of the transistor Q19. Also, the collectors of the transistors Q15 and Q17 are connected together and to the base of the transistors Q18. The transistor Q18 and Q19 and the constant current circuit IS13 form a logical OR circuit. The output signals of the comparison gate units $13_1$ and $13_m$, i.e., the selection signals SR, are input to the reference voltage terminals of the word driver units $2_1$ to $2_n$ of the word driver 2, i.e., the bases of the transistors Q2, Q5, etc., and the input terminal of the redundancy word driver 11, i.e., the base of the transistor Q20.

The mode of operation of the above-described embodiment will now be described. First, the read and write operations in the normal state will be described. In this case, the word address ADD is applied to the word address buffer 4, while the bit address is applied to the bit address buffer (not shown). Each of the address buffer units $4_1$ to $4_m$ outputs a high level or low level signal to a signal line of the decoder line 5 via the multi-emitter transistors Q11 and Q12, etc., in accordance with the level of each bit of the word address ADD. The the decoder lines 5 are respectively connected to the multi-emitter transistors. If one or more of the output signals of the multi-emitter transistors is a high level, the voltage level of the signal line becomes a high level. When, for example, the signal line connected to the base of the input transistor Q1 of the word driver unit $2_1$ becomes low level, the word driver unit $2_1$ outputs a high level word line selection signal to the high voltage word line WL+, whereby the word line is selected. Further, a pair of bit lines BL and $\overline{BL}$ are selected by a bit decoder, etc. (not shown). Thus, the read and write operations for the memory cell MC connected to the word line and a pair of bit lines selected as described above, are carried out.

The operation of the redundancy circuit portion will now be described.

The comparison gate unit $13_1$ forms an exclusive OR circuit. Therefore, if the word address signal ADD input to the unit $13_1$ and the defective address signal from the PROM are both high level or both low level, the unit $13_1$ outputs a low level selection signal SR. On the other hand, if one of address signals is high level while the other is low level, the unit $13_1$ outputs a high level selection signal SR.

In more detail, when the word address signal ADD is a high level, the transistor Q14 becomes ON while the transistor Q15 becomes OFF, whereby the base voltage of the output transistor Q19 becomes low level. If the defective word address signal output from the PROM to the base of the transistor Q17 is a high level, the transistor Q17 becomes ON while the transistor Q16 becomes OFF, whereby the base voltage of the output transistor Q18 becomes low level. As a result, the selection signal SR becomes low level.

When the word address signal ADD is a high level and the defective word address signal is a low level, the transistor Q17 becomes OFF and the transistor Q16 becomes ON, whereby the base voltage of the output transistor Q19 becomes low level and the base voltage of the output transistor Q18 becomes high level. Accordingly, the selection signal SR becomes high level.

When the word address ADD is a low level, the transistor Q14 becomes OFF and the transistor Q15 ON, whereby the base voltage of the output transistor Q18 becomes a low level. At this time, if the defective word address signal is a low level, the transistor Q17 becomes OFF and the transistor Q16 becomes ON, whereby the base voltage of the output transistor Q19 becomes low level so that the selection signal SR becomes low level.

When the word address signal ADD is a low level and the defective word address signal is a high level, the base voltage of the output transistor Q18 becomes low level while the base voltage of the output transistor Q19 becomes high level, whereby the selection signal SR becomes high level. As described above, the comparison gate unit $13_1$ executes an exclusive logical operation on the word address signal ADD and the defective word address signal from the PROM.

Figure 3:
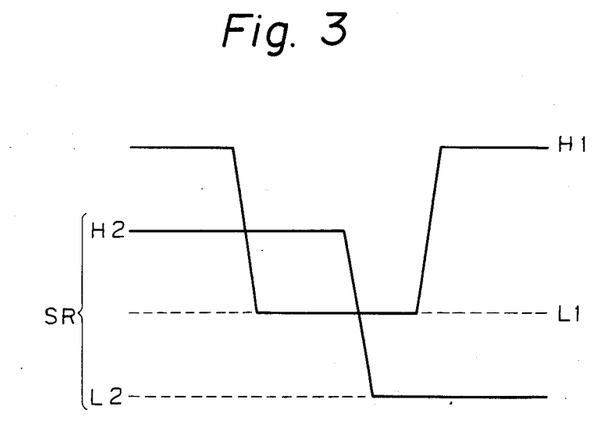
FIG. 3 is a graph of the voltage levels of the signals at various portions in the device of FIG. 2.

FIG. 3 shows the relationship between the signal level of the selection signal SR output from the comparison gate circuit 13 and the signal level of the input signal to the word driver. In FIG. 3, H1 and L1 indicate high and low logic levels of the input signal to the word driver 2, respectively. H2 and L2 indicate high and low levels of the selection signal SR, respectively. As clear from FIG. 4, the high and low levels H2 and L2 of the selection signal SR are shifted toward the low voltage side in comparison with the high and low levels H1 and L1 of the input signal. That is, the high level H2 of the selection signal SR is between the high and low levels H1 and L1 of the input signal, and the low level L2 is lower than the low level L1.

Further, the reference voltage VRF5 applied to the base of the transistor Q21 is between the high voltage level H2 and the low voltage level L2 of the selection signal SR.

In the circuit of FIG. 2, when the word address ADD does not coincide with a defective word address, accordingly, the selection signal SR is high level H2 and the output signal of the redundancy word driver 11 becomes low level, whereby the high voltage redundancy word line WL(R)+ of the redundancy memory cell array 10 becomes low level and the redundancy memory cell array 10 becomes a non-selection state. In this case, the selection signal SR is utilized as the reference voltage of each word driver unit of the word driver 2, and the read and write operations of the data described before are carried out.

On the other hand, when the word address ADD coincides with the defective word address from the PROM, all output signals of the comparison gate unit $13_1$ to $13_m$, corresponding to bits of the word address, become low level, whereby the selection signal SR becomes low level. In this case, the low voltage level L2 of the selection signal SR becomes lower than the low voltage level L1 of the logical signal input to each word driver unit of the word driver 2, as described before. Accordingly, when the word address ADD indicates a defective circuit portion, the selection signal SR becomes the low voltage level L2, whereby the transistors Q2 and Q5, etc., of each word driver unit become OFF while the transistors Q1 and Q4, etc., become ON, so the voltages of all high voltage word lines WL+ become low level, i.e., the non-selection level. Then, in the redundancy word driver 11, the transistor Q20 becomes OFF while the transistor Q21 becomes ON, whereby the redundancy word line WL(R)+ becomes high level and the redundancy memory cell array 10 is selected. In this a manner, the redundancy memory cell array 10 is accessed in place of the defective word address portion of the memory cell array 10.

In addition, when the word address ADD does not coincide with the defective word address stored in the PROM, the selection signal SR becomes high level H2, as described before, the output signal of the redundancy word driver 11 becomes low level and the redundancy memory cell array 10 enters the non-selection state.

Figure 4:
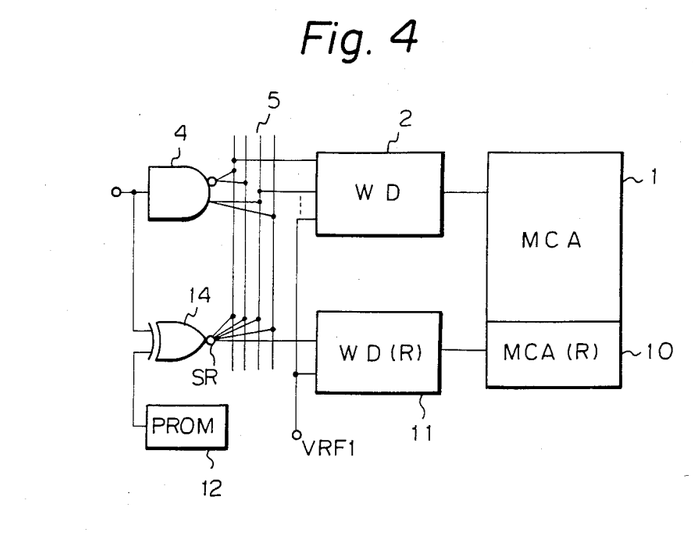
FIG. 4 is a partial block diagram of another embodiment of the bipolar-transistor type semiconductor memory device according to the present invention.

FIG. 4 is a circuit diagram of a semiconductor memory device according to another embodiment of the present invention. The memory device of FIG. 4, in the same manner as that of FIG. 2, replaces a defective circuit portion with a redundancy circuit portion in word line units.

Figure 5:
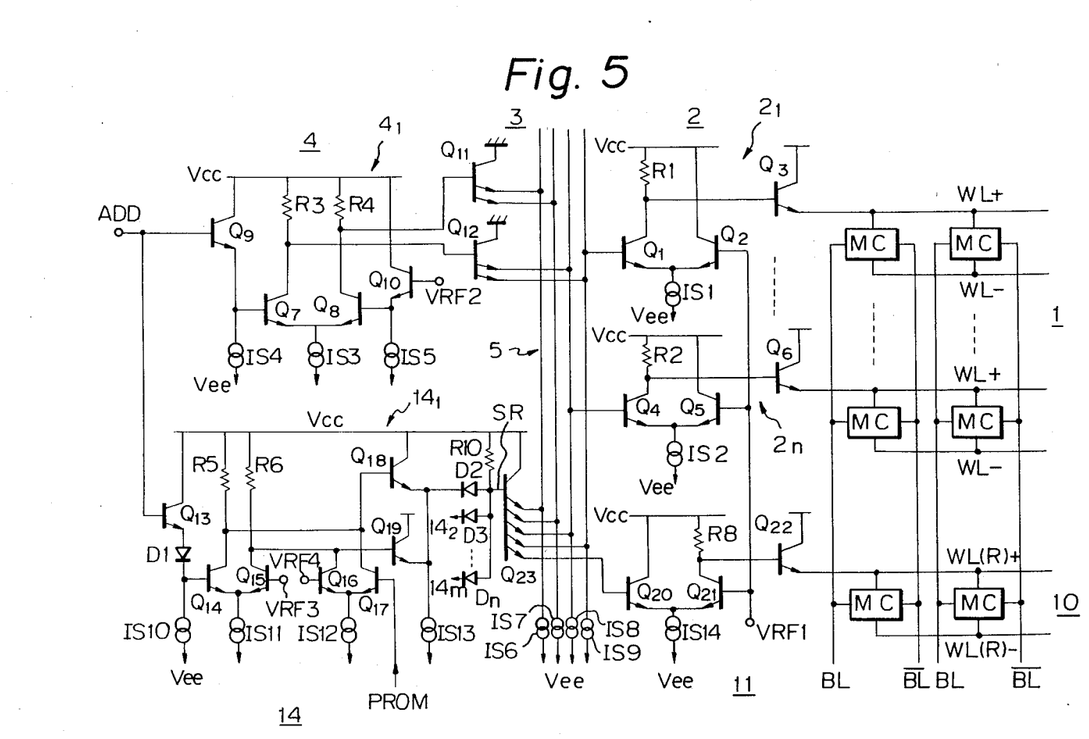
FIG. 5 is a more detailed circuit diagram of the memory device of FIG. 4.

The memory device includes a memory cell array 1, word driver 2, address buffer 4, decoder lines 5, redundancy memory cell array 10 connected to a redundancy word line, redundancy word driver 11, PROM 12 for storing an address of the redundancy circuit portion, and comparison gate circuit 14 for comparing an input word address ADD with read-out data from the PROM 12. In FIG. 5, an address buffer for a bit address, bit driver, input-output circuit, etc. are not shown so as to simplify the figure.

In the memory device of FIG. 4, when the input word address ADD does not coincide with a defective word address from the PROM 12, the same read and write operations as those in FIG. 2 are performed. That is, the memory cell array 1 is accessed by the word driver 2 so that read and write operations are carried out.

On the other hand, when the input word address ADD coincides with a defective word address from the PROM 12, the selection signal SR is output from the comparison gate circuit 14. Then, due to the presence of the selection signal SR, all signal lines of the decoder line 5 enter the non-selection state, whereby the word line selection signal to be applied to the memory cell array 1 is cut off. On the other hand, the redundancy word driver 11 outputs the word line selection signal to the redundancy memory cell array 10 due to the application of the selection signal SR. As a result, the redundancy memory cell array 10 is selected and the read and write operations for the redundancy memory cell array 10 are carried out.

FIG. 5 is a circuit diagram of the memory device of FIG. 4. In FIG. 5, elements the same as in FIG. 2 bear the same reference numerals. The differences are, first, in the comparison gate unit $14_1$ in which the collector of the transistor Q14 is connected to the base of the transistor Q18, and the collector of the transistor Q15 is connected to the base of the transistor Q19. The comparison gate unit $14_1$ operates as an exclusive NOR circuit.

Further, a plurality of diodes D2 to Dn and a resistor R10, forming an AND gate, and a multi-emitter transistor Q23 are added. The diodes D2 to Dn are connected to the comparison gate units $14_1$ to $14_m$ provided for each bit of the word address ADD. The emitters of the multi-emitter transistor Q23 are connected to the signal lines of the decoder line 5 and the input terminal of the redundancy word driver 11, i.e., the base of the transistor Q20. The output signal from the comparison gate units $14_1$ to $14_m$ are applied to the base of the multi-emitter transistor Q23 via the diodes D2 to Dn, respectively. The reference voltage VRF1 is applied, respectively, to each reference signal input terminal of the ECL gate of the word driver 2 (i.e., the base of the transistors Q2, Q5, etc.) and the reference signal input terminal of the redundancy word driver 11 (i.e., the base of the transistor Q21).

The mode of operation of the semiconductor memory device described above will now be described. The comparison gate unit $14_1$ forms an exclusive NOR circuit. Therefore, when the input word address signal ADD and the redundancy address signal from the PROM are both high level or both low level, the unit $14_1$ outputs a high level output signal. On the other hand, when one of them is high level and the other low level, the unit $14_1$ outputs a low level output signal.

In more detail, when the word address signal ADD is high level, the transistor Q14 becomes ON while the transistor Q15 becomes OFF. Thus, the base voltage of the output transistor Q18 becomes low level. Then, if the defective word address signal output from the PROM to the base of the transistor Q17 is high level, the transistor Q17 becomes ON while the transistor Q16 becomes OFF, whereby the base voltage of the output transistor Q19 becomes high level. As a result, the output signal becomes high level.

When the word address signal ADD is high level and the defective word address signal is low level, the transistor Q17 becomes OFF and the transistor Q16 becomes ON. Thus, the base voltage of the output transistor Q19 becomes low level and the base voltage of the output transistor Q18 becomes low level as described above. Accordingly, the output signal becomes low level.

When the word address signal ADD is low level, the transistor Q14 becomes OFF and the transistor Q15 becomes ON, whereby the base voltage of the output transistor Q19 becomes low level. Then, if the defective word address signal is low level, the transistor Q17 becomes OFF while the transistor Q16 becomes ON. Thus, the base voltage of the output transistor Q18 becomes high level so that the output signal becomes high level.

When the word address signal is low level and the defective word address signal is high level, the base voltage of the output transistor Q18 becomes low level while the base voltage of the output transistor Q19 becomes low level, whereby the output signal becomes low level.

As described above, the comparison gate unit $14_1$ executes an exclusive NOR operation on the word address signal ADD and the defective word address signal from the PROM. All output signals of the comparison gate units $14_1$ to $14_m$ are subjected to an AND operation by the AND circuit formed by the diodes D2 to Dn and the resistor R10. The AND circuit outputs the selection signal SR to the multi-emitter transistor.

In the circuit of FIG. 5, when the word address signal ADD does not coincide with a defective word address, the selection signal SR is low level, the output signal of the redundancy word driver 11 becomes low level. The high voltage redundancy word line WL(R)+ of the redundancy memory cell array 10 also becomes low level and the redundancy memory cell array 10 enters the non-selection state. In this case, the normal read and write operations of data are carried out.

On the contrary, when the word address ADD coincides with a defective word address from the PROM, all output signals of the comparison gate units $14_1$ to $14_m$, corresponding to bits of the word address, become high level, and therefore, the selection signal SR becomes high level. Accordingly, all the decoder lines 5 are made a high voltage level by the multi-emitter transistor Q23, whereby all high voltage word lines WL+ of the memory cell array 1 become low voltage level, i.e., the non-selection voltage level. Simultaneously, in the redundancy word driver 11, the transistor Q20 becomes ON while the transistor Q21 becomes OFF, whereby the redundancy word line WL(R)+ becomes high level and the redundancy memory cell array 10 is selected. In such a manner, the redundancy memory cell array 10 is accessed in place of the defective word address circuit portion.

Although preferred embodiments have been described heretofore, various modifications and alterations are possible within the scope of the present invention. For example, although the above-described embodiments relate to a redundancy circuit for word lines, it is obvious that the redundancy exchange is also possible for bit lines. Furthermore, the number of redundancy memory cell arrays is not limited to one. For two redundancy addresses, the memory device may be provided with two sets of redundancy circuits, i.e., two redundancy memory cell arrays, redundancy word drivers, PROM's, comparison gate circuits, etc. Furthermore, in FIG. 5, it is possible to form the word driver by a diode matrix in place of the ECL gate.

We claim:

1. A bipolar-transistor type semiconductor memory device, operatively connected to receive an input address signal, and having a redundancy configuration for a defective memory cell, said memory device comprising:
    a memory cell array including memory cells and the defective memory cell;
    a redundancy memory cell array;
    a redundancy address decision circuit, operatively connected to receive the input address signal, for comparing the input address signal with a predetermined address signal of said defective memory cell and outputting a low level switching signal when the input address signal coincides with the predetermined address signal and a high level switching signal when the input address signal does not coincide with the predetermined address signal;
    a driving circuit including a first emitter-coupled logic gate connected to receive the switching signal as a reference voltage, and the input address signal and operatively connected to said memory cell array, for enabling said memory cell array in accordance with the input address signal when said first emitter-coupled logic gate receives the high level switching signal, said driving circuit being inhibited from enabling said memory cell when said first emitter-coupled logic gate receives the low level switching signal; and
    a redundancy driving circuit, including a second emitter-coupled logic gate operatively connected to receive the switching signal from said redundancy address decision circuit as an input signal and operatively connected to said redundancy memory cell array, for enabling said redundancy memory cell array when the high level switching signal is applied to said second emitter-coupled logic gate, the input signal of said first emitter-coupled logic gate having high and low voltage levels, the voltage level of the switching signal becoming low when the input address signal coincides with the predetermined address signal of said defective memory cell, the voltage level of the switching signal becoming high when there is no coincidence between the input address signal and the predetermined address signal, the high and low voltage levels of the switching signal being arranged such that the high voltage level of the switching signal is between the high and low voltage levels of the input signal and the low voltage level of the switching signal is lower than the low voltage level of the input signal, and the voltage level of a reference voltage of said second emitter-coupled logic gate is between the high and low voltage levels of the switching signal.

2. A bipolar-transistor type semiconductor memory device having a redundancy configuration according to claim 1, wherein the high voltage level of said switching signal is between the high and low levels of the input signal, and the low voltage level of said switching signal is lower than the low voltage level of the input signal.

3. A bipolar-transistor type semiconductor memory device having a redundancy configuration according to claim 1, wherein said redundancy address decision circuit comprises:
    a memory circuit for storing the address of the defective circuit portion; and
    a comparison gate, operatively connected to said memory circuit and operatively connected to receive the input signal, for comparing the input signal with the address in said memory circuit.

4. A bipolar-transistor type semiconductor memory device having a redundancy configuration according to claim 3, wherein said comparison gate is an exclusive OR circuit.

5. A bipolar-transistor type semiconductor memory device having a redundancy configuration according to claim 3, wherein said memory circuit is a programmable read-only memory.

6. A bipolar-transistor type semiconductor memory device having a redundancy configuration according to claim 3, wherein said driving circuit and said redundancy driving circuit each comprise:
    an emitter-coupled logic gate; and
    a driving transistor, operatively connected between said emitter coupled logic gate and said memory cell array, for enabling one of said memory cells in said memory cell array.

7. A bipolar-transistor type semiconductor memory device, operatively connected to receive an input address signal, and having a redundancy configuration for a defective memory cell, said memory device comprising:
    a memory cell array including memory cell and the defective memory cell;
    a redundancy memory cell array;
    a redundancy address decision circuit, operatively connected to receive the input address signal, for comparing the input address signal with a predetermined address signal of the defective memory cell, and outputting a high level switching signal when the input address signal coincides with the predetermined address signal of the defective memory cell and a low level switching signal when the input address signal does not coincide with the predetermined address signal, said redundancy address decision circuit comprising:
    a memory circuit for storing the address of the defective circuit portion;
    a comparison gate, operatively connected to said memory circuit, for comparing the input address with the address in said memory circuit and outputting an output signal; and
    a multi-emitter transistor, operatively connected to receive the output signal from said comparison gate;
    a decoding circuit, operatively connected to receive the input address signal and the switching signal, for decoding the input address signal and outputting decoded output signals corresponding to the input address signals, said decoding circuit comprising:

an address buffer circuit having output lines; and decoder lines respectively, operatively connected to the output lines of said address buffer circuit and to the emitters of said multi-emitter transistor;

a driving circuit, operatively connected to receive the decoded output signals and operatively connected to said memory cell array, for enabling said memory cell array in accordance with the decoded output signals corresponding to the input address signals during a normal state when the switching signal is the low level; and a redundancy driving circuit, operatively connected to said redundancy memory cell array and the emitters of said multi-emitter transistor, and connected to receive the switching signal, for enabling said redundancy memory cell array when the switching signal is the high level and disabling the redundancy memory cell array during the normal state;

a decoded output signal from said decoding circuit being in a non-selection state in which said driving circuit disables said memory cell array at the same time said redundancy driving circuit enables said redundancy memory cell array when said redundancy address decision circuit outputs the high level switching signal.

8. A bipolar-transistor type semiconductor memory device having a redundancy configuration according to claim 7, wherein said comparison gate is an exclusive NOR circuit.

9. A bipolar-transistor type semiconductor memory device having a redundancy configuration according to claim 7, wherein said memory circuit is a programmable read-only memory.

10. A bipolar-transistor type semiconductor memory device having a redundancy configuration according to claim 7, wherein said driving circuit and said redundancy driving circuit each comprise:

an emitter-coupled logic gate; and a driving transistor, operatively connected between said emitter-coupled logic gate and said memory cell array, for enabling one of said memory cells of said memory cell array.

11. A bipolar-transistor type semiconductor memory device having a redundancy configuration according to claim 7, wherein said driving circuit and said redundancy driving circuit are formed by diode matrixes.

* * * * *

UNITED STATES PATENT AND TRADEMARK OFFICE
CERTIFICATE OF CORRECTION

PATENT NO. : 4,796,233
DATED : JANUARY 3, 1989
INVENTOR(S) : TOMOHARU AWAYA ET AL.

It is certified that error appears in the above-identified patent and that said Letters Patent is hereby corrected as shown below:

Col. 3, line 20, "inputoutput" should be --input-output--.

Col. 4, line 47, after "$13_1$" insert --generally--;

line 48, delete "generally".

Signed and Sealed this

Sixth Day of June, 1989

Attest:

DONALD J. QUIGG

Attesting Officer

Commissioner of Patents and Trademarks